United States Patent
Xu et al.

(10) Patent No.: US 11,303,264 B1
(45) Date of Patent: Apr. 12, 2022

(54) ACTIVE FILTER FOR ELECTROMAGNETIC INTERFERENCE (EMI) REDUCTION USING A SINGLE CONNECTION POINT AND A NEGATIVE IMPEDANCE CONVERTER

(71) Applicant: Hong Kong Applied Science and Technology Research Institute Company, Limited, Hong Kong (HK)

(72) Inventors: Danting Xu, Hong Kong (HK); Ziyang Gao, Hong Kong (HK); Kun Wu, Shenzhen (CN)

(73) Assignee: Hong Kong Applied Science and Technology Research Institute Company Limited, Hong Kong (HK)

(*) Notice: Subject to any disclaimer, the term of this patent is extended or adjusted under 35 U.S.C. 154(b) by 0 days.

(21) Appl. No.: 17/091,089

(22) Filed: Nov. 6, 2020

(51) Int. Cl.
*H03H 11/04* (2006.01)
*H03F 3/45* (2006.01)
(Continued)

(52) U.S. Cl.
CPC ............... *H03H 11/04* (2013.01); *H01C 7/04* (2013.01); *H03F 3/21* (2013.01); *H03F 3/45475* (2013.01)

(58) Field of Classification Search
CPC .......... H02M 1/44; H02M 1/123; H02M 1/15; H02M 1/14; H02M 1/126; H02M 1/32;
(Continued)

(56) References Cited

U.S. PATENT DOCUMENTS 8,823,448 B1* 9/2014 Shen ................ H02M 1/44
327/552
9,048,817 B2* 6/2015 Shen ................ H02M 1/44
(Continued)

FOREIGN PATENT DOCUMENTS

WO WO2004001927 A2 12/2003
WO WO2015173006 A 11/2015

OTHER PUBLICATIONS

Dong et al., "Equivalent Parallel Capacitance Cancellation of Common Mode Chokes using Negative Impedance Converter for Common Mode Noise Reduction", Journal of Power Electronics, vol. 19 No. 5, pp. 1326-1335, Sep. 2019.
(Continued)

*Primary Examiner* — John W Poos
(74) *Attorney, Agent, or Firm* — g Patent LLC; Stuart T. Auvinen (57) ABSTRACT

An active filter reduces Electro-Magnetic Interference (EMI) created by current flowing through a power line. The active filter connects to the power line at a single node through a connection capacitor. A sense current flows through the connection capacitor when the power line current changes. This sense current is applied to a non-inverting input of an op amp to drive a power amplifier circuit through a filter capacitor. The power amplifier circuit increases the current drive of the op amp to charge a transfer capacitor that converts the power amplifier output current to a transfer voltage. The transfer capacitor is connected to the connection capacitor so that the transfer voltage is injected back into the power line through the connection capacitor as an injected voltage that compensates for the sensed current. Op amp gain is adjustable by variable resistors that connect to the inverting input of the op amp.

19 Claims, 12 Drawing Sheets

(51) Int. Cl.
   *H03F 3/21* (2006.01)
   *H01C 7/04* (2006.01)
(58) Field of Classification Search
   CPC .. H02M 1/007; H02M 1/0032; H02M 1/4225;
   H02M 1/42; H02M 1/08; H02M 3/158;
   H02M 1/4208; H02M 3/1584; H02M
   1/0009; H02M 1/0058; H03H 11/04;
   H02J 3/01
   USPC ......................................................... 327/553
   See application file for complete search history.

(56) References Cited

U.S. PATENT DOCUMENTS

| | | | |
|---|---|---|---|
| 10,284,078 | B1 | 5/2019 | Knoedgen et al. |
| 10,476,464 | B2 | 11/2019 | Rambaud et al. |
| 2014/0292401 | A1 | 10/2014 | Shen |
| 2015/0212133 | A1* | 7/2015 | Stahl ........................ G01R 1/30 324/613 |
| 2018/0294714 | A1* | 10/2018 | Chu ......................... H02M 1/44 |
| 2019/0029148 | A1 | 1/2019 | Han et al. |

OTHER PUBLICATIONS

Chen et al., "An Experimental Study of Common- and Differential-Mode Active EMI Filter Compensation Characteristics", IEEE Transactions on Electromagnetic Compat., vol. 51 No. 3, pp. 683-691, Jun. 2009.

Poon et al., "Techniques for Input Ripple Current Cancellation: Classification and Implementation", IEEE Trans. Power Elect., vol. 15, No. 6, pp. P1114-P1152, Nov. 2000.

Dongil Shin et al., "Quantified Design Guidelines of a Compact Transformerless Active EMI filter for Performance, Stability, and High Voltage Immunity", IEEE Trans. Power elect., vol. 33, No. 8, pp. 6723-6737, Aug. 2018.

Narayanasamy & Luo, "A Survey of Active EMI filters for Conducted EMI Noise Reduction in Power Electronic Converters", IEEE Trans electromag compat, vol. 61, No. 6, pp. 2040-2049, Dec. 2019.

ISR and Written Opinion, PCT/CN2020/1 27670, dated Aug. 6, 2021.

* cited by examiner

FIG. 1

PRIOR ART

ACTIVE FILTER FOR ELECTROMAGNETIC INTERFERENCE (EMI) REDUCTION USING A SINGLE CONNECTION POINT AND A NEGATIVE IMPEDANCE CONVERTER

FIELD OF THE INVENTION

This invention relates to active filter circuits, and more particularly to single-point sense-and-inject active filters for Electro-Magnetic Interference (EMI) reduction.

BACKGROUND OF THE INVENTION

Filters are used for a variety of circuits. For example, a Switch-Mode Power Supply (SMPS) has power transistors that are rapidly turned on and off, such as at a rate of a few hundred of kHz. These SMPS can deliver energy to home appliances, computers, medical devices, telecom systems, automotive systems, and many other applications.

However, the rapid switching of the transistors in the SMPS can create Electro-Magnetic Interference (EMI) in other devices. Standards have been set to limit such EMI, such as the EN55022 standard that many SMPS must pass.

Passive EMI filters are traditionally added to power supplies and other EMI-generating devices. These passive EMI filters tend to be large and bulky since they rely upon inductors and capacitors. Although passive EMI filters are simple and effective at reducing EMI, they can be bulky, heavy, and have a power loss.

Figure 1:
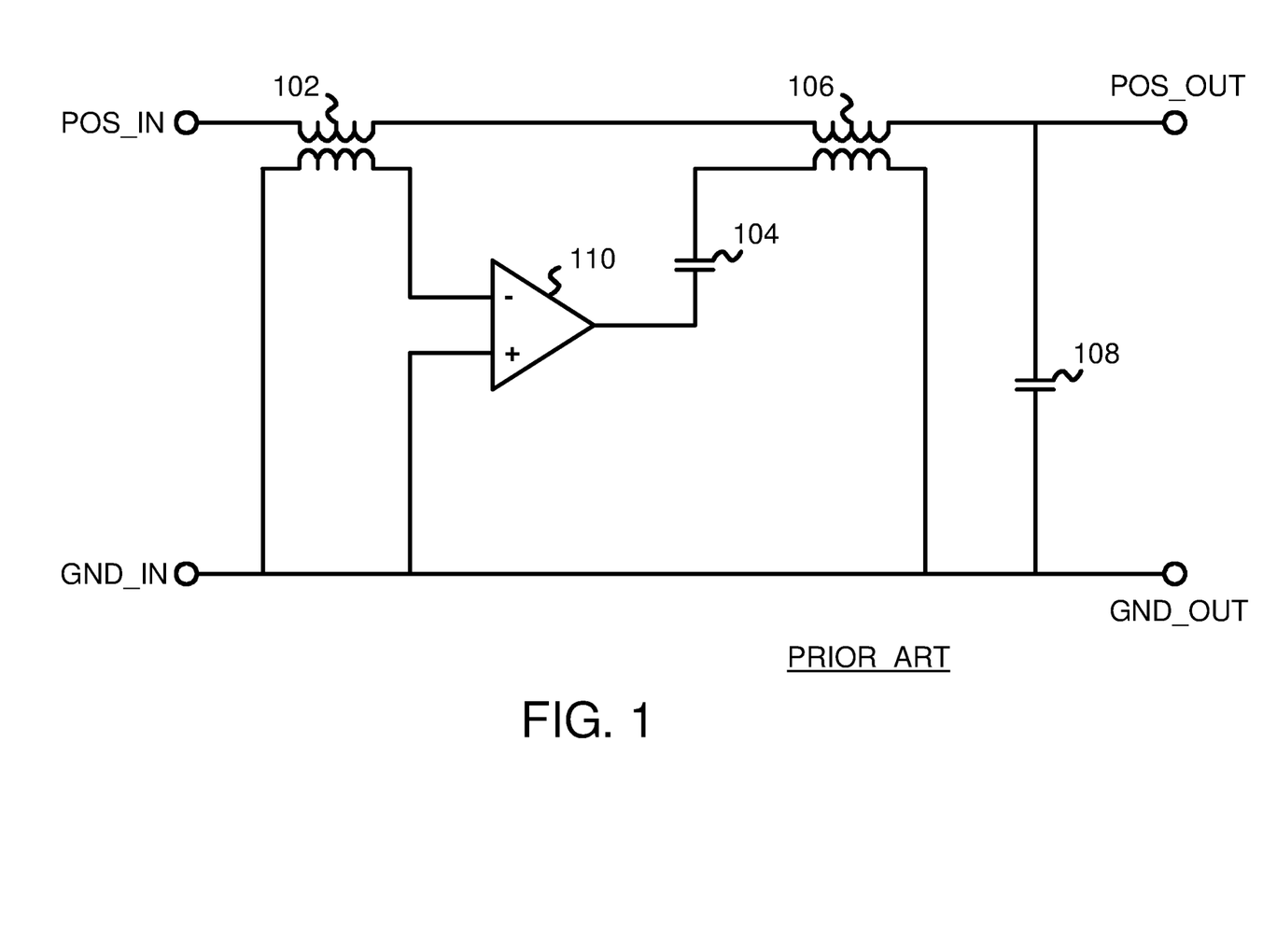
FIG. 1 shows a prior-art active EMI filter with separate sensor and injection points.

Active EMI filters can use an op amp with a more complex circuit to reduce the size and bulk of the EMI filter. FIG. 1 shows a prior-art active EMI filter with separate sensor and injection points. A positive input POS_IN is filtered to generate a positive output POS_OUT that has reduced EMI. Capacitor 108 between POS_OUT and ground GND_OUT helps to maintain a constant supply voltage on POS_OUT when variations occur in the load current.

The power current from POS_IN is sensed by sense inductor 102. Current changes such as an increase in the power current flowing through the primary windings of sense inductor 102 induce a current in the same direction in the secondary windings of sense inductor 102. Sense inductor 102 increases the voltage on the inverting input of op amp 110, which generates an opposite voltage at the bottom terminal of capacitor 104. The charge on capacitor 104 causes a positive voltage at the top terminal of capacitor 104. Since the current is sinking into the output of the operational amplifier through capacitor 104, the voltage on injector inductor 106 will inject the compensated voltage through the secondary windings of injector inductor 106, cancelling the noise voltage in the main. Thus the noise voltage is reduced by the active filter.

The active filter has separate sense and injection points. Sense inductor 102 senses the current changes in the power supply, while injector inductor 106 injects a back-current into the power line to compensate for the sensed voltage. While the active filter is smaller than a passive filter, having separate sense and injection points can still required two bulky inductors. Some active filters replace one of sense inductor 102, injector inductor 106 with a capacitor, but the remaining inductor is still bulky and therefore undesirable. Bulky inductors not only occupy much space and weight, but also have bandwidth limitations due to parasitic, non-ideal coupling, and self-resonance of inductors.

What is desired is an active EMI filter that has no inductors. An active EMI filter having a single point of connection to the power line is desired. An active EMI filter that has a single-point connection through a capacitor is desired. It is desired that the single-point connection capacitor both senses current changes and injects compensation back into the power line. An active filter that uses a negative capacitance concept is desired to sense and drive feedback the single-point capacitor. An active filter with variable components is desired for gain compensation for temperature and frequency bands is also desired.

DETAILED DESCRIPTION

The present invention relates to an improvement in active filters. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 2:
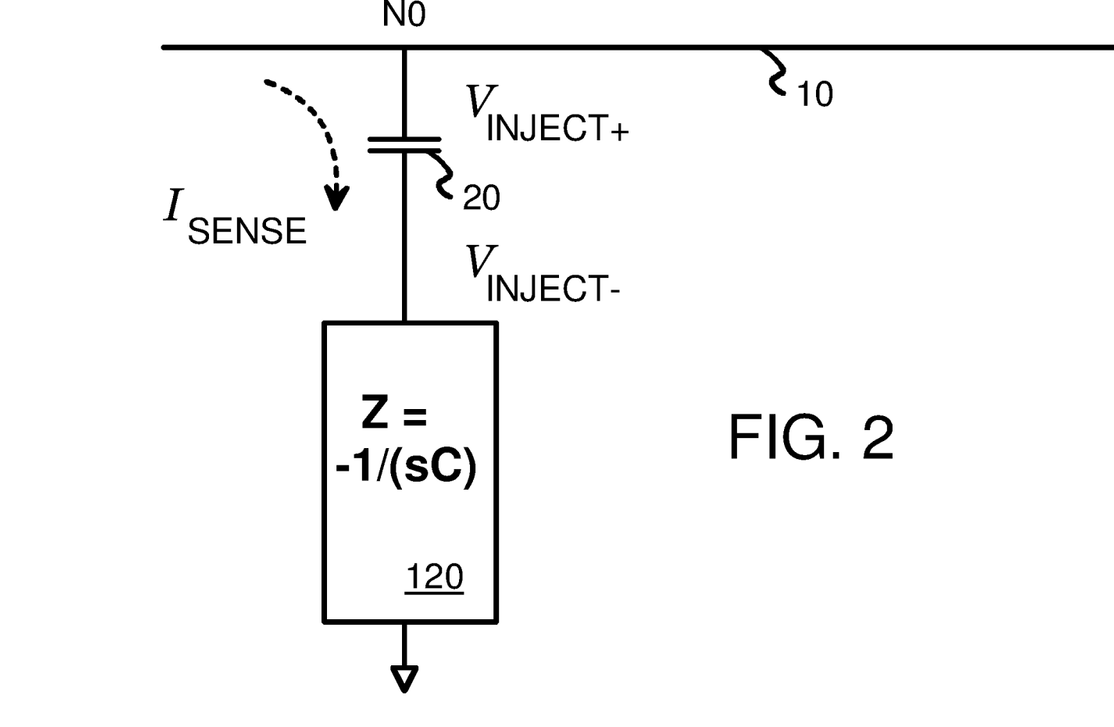
FIG. 2 highlights an active filter with a single point of attachment.

FIG. 2 highlights an active filter with a single point of attachment. Node NO is a single node on line 10, which can be a power-supply line in a SMPS or a line that is being filtered to reduce noise such as produced by EMI from line 10. Connection capacitor 20 connects to node NO on line 10. The other terminal of connection capacitor 20 connects to negative capacitance circuit 120.

Connection capacitor 20 acts as both the sensor and the injector of the active filter. Changes in the current flowing along line 10 cause a sensed current $I_{SENSE}$ to flow through connection capacitor 20 from line 10 to negative capacitance circuit 120. In response, negative capacitance circuit 120 generates a voltage change $V_{INJECT}$ that is applied to connection capacitor 20 and injected back into line 10. $V_{INJECT}$ compensates for $I_{SENSE}$ to reduce the current fluctuation in line 10, and thus reduce the EMI generated by line 10.

Negative capacitance circuit 120 has an impedance in the form of $Z=V/I=-1/(sC)$, where V and I are the AC voltage drop and current on negative capacitance circuit 120, s is a scale constant and C is an effective capacitance. In the frequency domain, for a normal positive capacitance, as a current I flows through a capacitor, the voltage drop across the capacitor will be $(1/sC) \times I$, where the coefficient $(1/sC)$ is the impedance of the capacitor, and in time domain the current will lead the voltage by 90 degrees. With a negative capacitance, the voltage drop across the capacitance will be $(-1/sC) \times I$, where the coefficient $(-1/sC)$ is the impedance of the negative capacitance circuit, and in time domain the current will lag the voltage by 90 degrees. In this way, the voltage drops across a positive capacitance and a negative capacitance will be anti-phase (180-degree difference).

When the sensed current $I_{SENSE}$ flows in the direction as shown in FIG. 2 through connection capacitor 20 and negative capacitance circuit 120 to the ground, negative capacitance circuit 120 acts as a negative capacitance, so negative capacitance circuit 120 produces a negative voltage drop between its two terminals rather than a positive voltage drop. Negative capacitance circuit 120 acts as a current-controlled-voltage source with an input impedance of $Z=-1/(sC)$.

Since the bottom terminal of negative capacitance circuit 120 is ground, the voltage at the top terminal of negative capacitance circuit 120 is negative. The negative voltage generated by negative capacitance circuit 120 pulls the voltage of the bottom plate of connection capacitor 20 lower in voltage. Since connection capacitor 20 is a regular capacitance, the charge in it generates a voltage difference between $V_{inject}+$ and $V_{inject}-$. $V_{inject}+$ is pulled low because $V_{inject}-$ is pulled lower by the negative capacitance 120, helping to reduce noise voltage $V_{inject}+$ in line 10 and thus reduce EMI.

Figure 3:
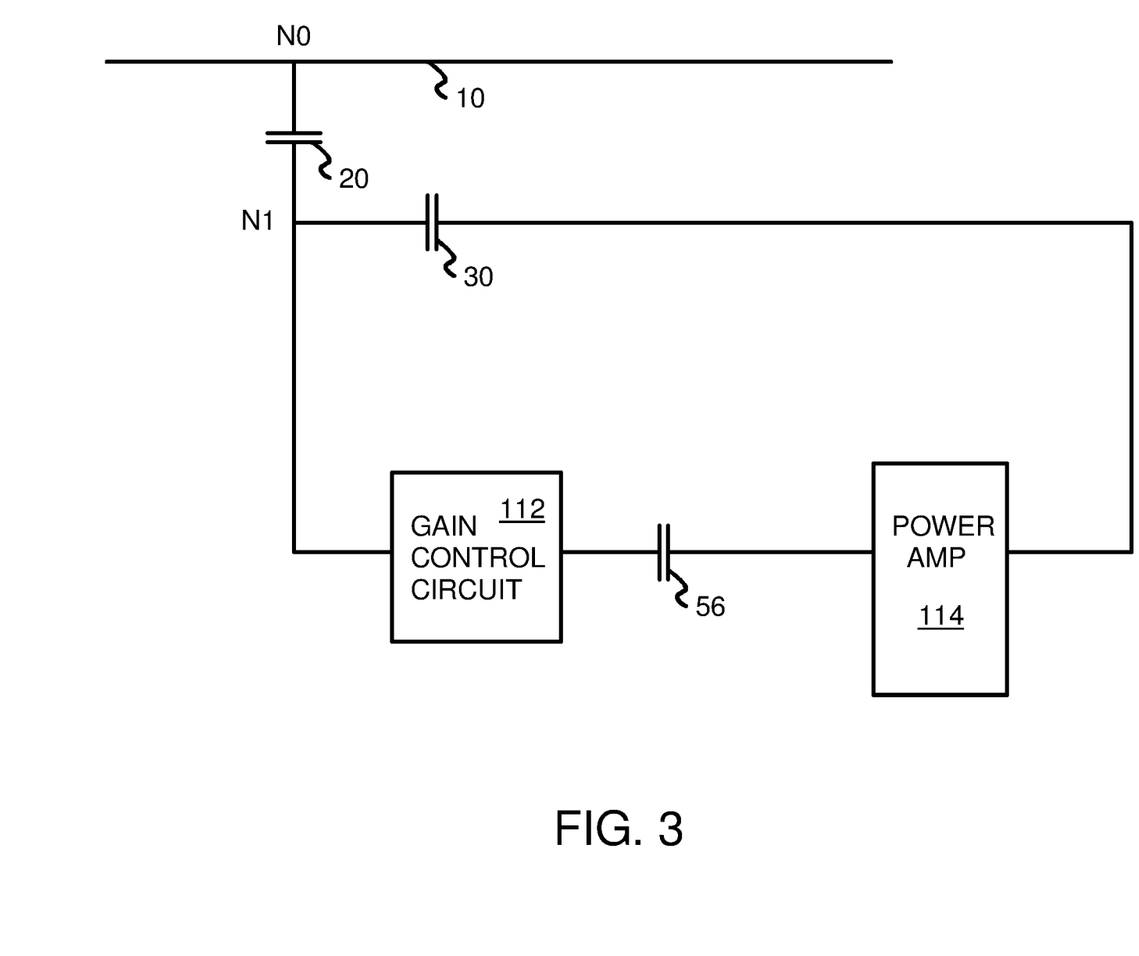
FIG. 3 shows a high-level block diagram of the active filter.

FIG. 3 shows a high-level block diagram of the active filter. Connection capacitor 20 connects to node NO of line 10. Changes in the current flowing through line 10 are sensed by connection capacitor 20 and applied to an input of gain control circuit 112. The output of gain control circuit 112 is in phase with the input, and is applied to filter capacitor 56, which connects gain control circuit 112 to the input of power amplifier 114. Power amplifier 114 provides a higher current to drive transfer capacitor 30.

Gain Control circuit 112 acts as a resistive voltage divider circuit. Capacitors 20, 30 act as a capacitive voltage divider. The voltage at node N1 between capacitors 20, 30 is driven below ground by higher current in line 10, as negative capacitance circuit 120 did in FIG. 2. The voltage of node N1 going below ground is coupled across connection capacitor 20 to inject a compensation voltage back into line 10 to compensate for the higher current in line 10.

Figure 4:
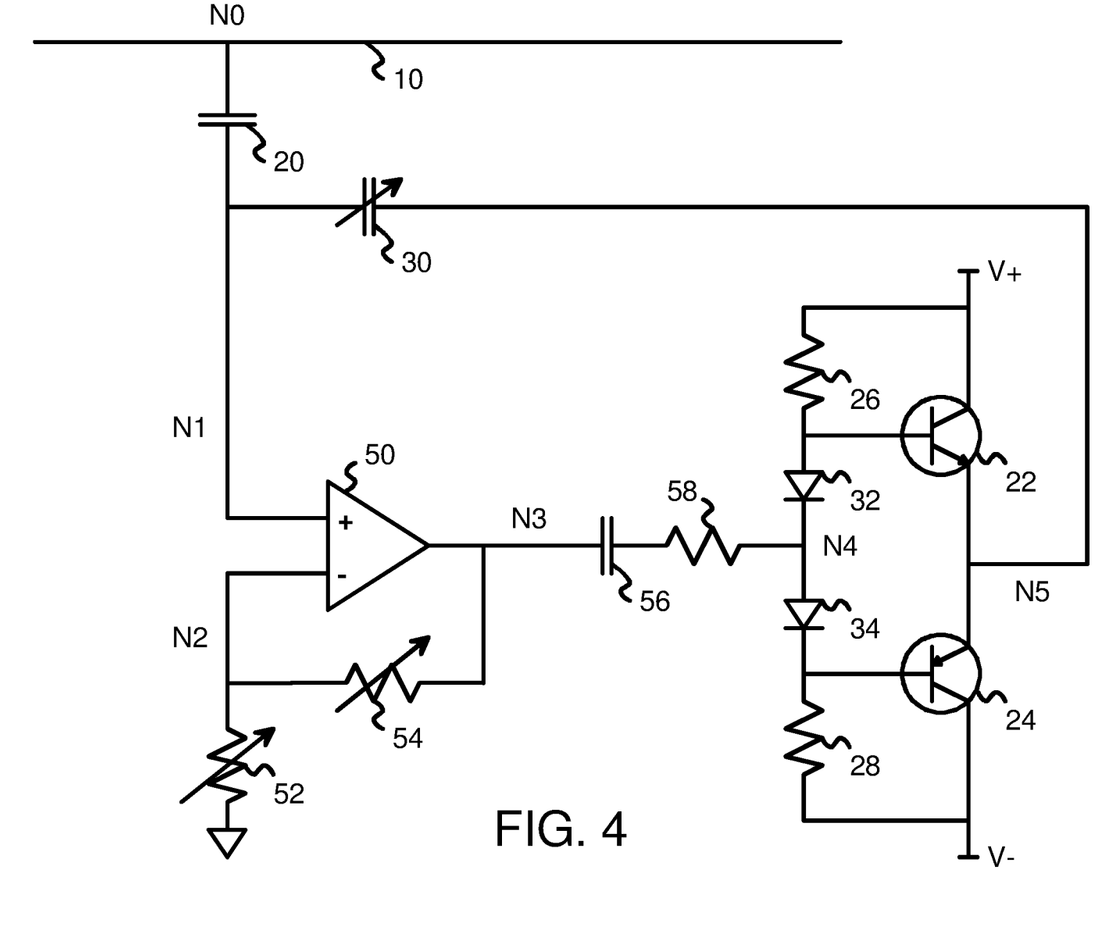
FIG. 4 is a schematic of the single-point active filter with negative capacitance.

FIG. 4 is a schematic of the single-point active filter with negative capacitance. A higher current flowing on line 10 is sensed by current flowing into connection capacitor 20, which must also flow through transfer capacitor 30 because no current flows into the inputs of operational amp (op amp) 50. The input voltage of the power amplifier, node N4, must adjust to cause power amplifier transistors 22, 24 to source or sink the changes in the sense current through transfer capacitor 30.

The voltages on the inputs to op amp 50 are forced to be equal to each other by the feedback of the op amp output current through variable resistor 54 to the inverting input, with a bias voltage set by the variable resistors 52, 54, which form a voltage divider. Filter capacitor 56 and resistor 58 block DC and allow AC signals to pass through from the output of op amp 50, node N3, to the input of the power amplifier, node N4. Node N3, N4, and N5 have equal AC voltages.

The voltages on the inputs to op amp 50 are forced to be equal to each other (VN1=VN2) due to op-amp's inherent feature. Therefore, the voltage drop on transfer capacitor 30 and variable resistor 54 will be the same (V30=V54). Since the current flowing into the capacitive branch of capacitors 20, 30 are sinking into the active circuit, and the voltage at N5 and N3 are the same, currents in the resistive branch of resistors 52, 54 will also be sinking into op amp 50. Thus the voltage at Node N2 (VN2) will be lower than ground, and the voltage at Node N3 (VN3) will be lower than N2. In this way, the AC EMI noise voltage at node NO on line 10 will be pulled low depending on the values of connection capacitor 20 and the negative capacitance.

The output of op amp 50, node N3, drives filter capacitor 56 which drives the input node N4 of the power amp stage through resistor 58. The output of the power amplifier, node N5, is driven high by PNP transistor 22 which has its collector drive by positive supply voltage V+, and is driven low by NPN transistor 24 which has its collector drive by negative supply voltage V-.

The bases of PNP transistor 22 and NPN transistor 24 are biased by a divider network between V+ and V- of resistor 26 from V+ to the base of PNP transistor 22, then through diode 32 to node N4 and through diode 34 to the base of NPN transistor 24, and resistor 28 to negative supply V-. Transistors 22, 24 provide a large current to transfer capacitor 30.

When a larger current flows through line 10, current is injected through connection capacitor 20 and transfer capacitor 30, which form a capacitive voltage divider to charge node N1 higher. The higher N1 on the non-inverting input of op amp 50 drives output N3 higher with a gain determined by the ratio of resistors 52, 54. The higher N3 is coupled through filter capacitor 56 to shift node N4 higher, increasing the base voltages of transistors 22, 24, causing NPN transistor 24 to drive more current and PNP transistor 22 to drive less current. The increased pull-down current absorbs the increased sense current through capacitors 20, 30. The increased current sink through NPN transistor 24 pulls charge from transfer capacitor 30, which converts this charge loss to a voltage drop. The lower voltage on transfer capacitor 30 is coupled to connection capacitor 20 by charge sharing, causing a lower voltage to be injected to line 10 by connection capacitor 20. This lower injected voltage compensates for the higher current along line 10.

Resistors 52, 54 have a variable resistance, allowing the gain of op amp 50 to be adjusted by adjusting the resistor ratio. The capacitance of transfer capacitor 30 is also variable, allowing adjustment or scaling of the injected voltage. These variable resistances and capacitance can be adjusted to compensate for temperature, or for different operating conditions such as when a different frequency band or switching frequency is selected.

Figure 5A:
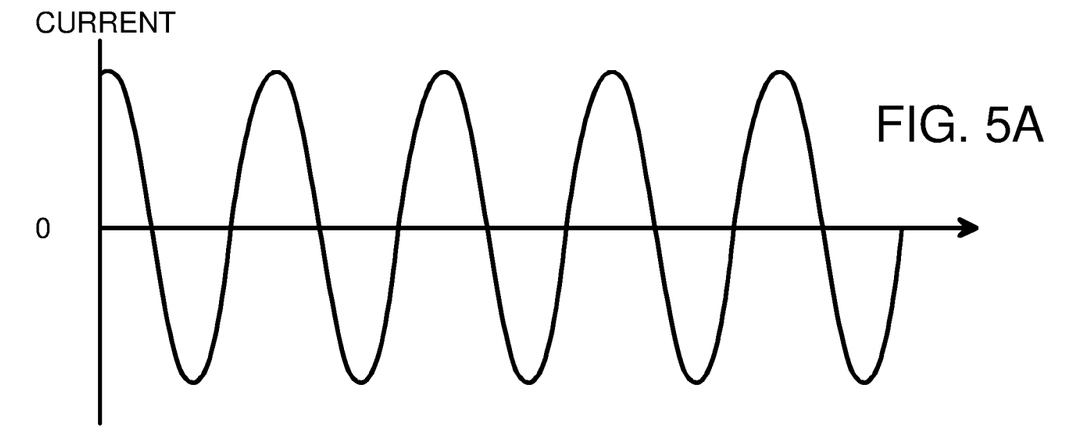
FIGS. 5A-5B are graphs of operation of the active filter.
Figure 5B:
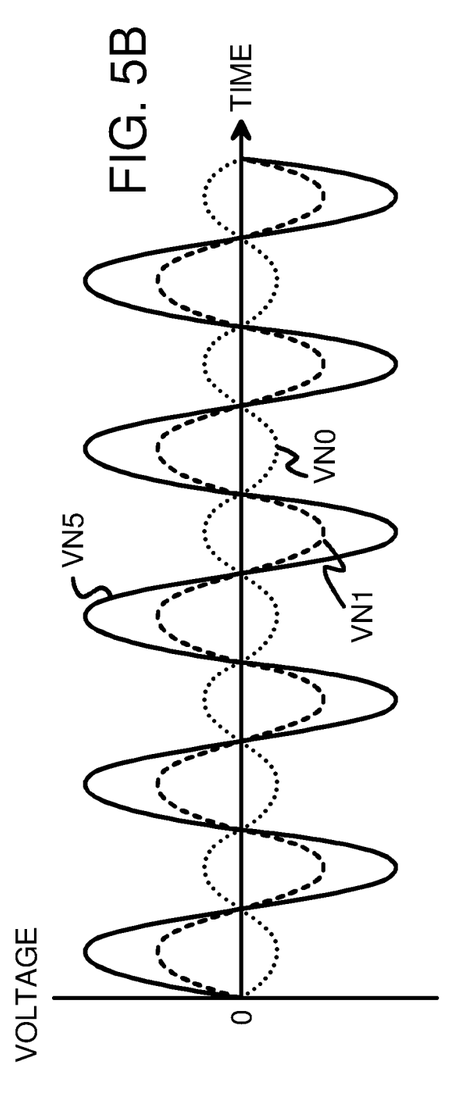

FIGS. 5A-5B are graphs of operation of the active filter. In FIG. 5A, the current flowing along line 10 oscillates, such as at a frequency of switching of the power transistors in a Switch-Mode Power Supply. This current is sensed through connection capacitor 20 and amplified by op amp 50 to drive the power amplifier.

In FIG. 5B, the power amplifier drives current to its output, node N5, causing the voltage of node N5, VN5, to rise as a result of the rising current in line 10, and to fall as a result of falling current in line 10, but a 90-degree phase shift is introduced by the power amplifier by the capacitor's VI characteristics, wherein for a positive capacitor, the current leads voltage by 90 degrees. The sensed current Isense flows into the op-amp's output N3 through capacitors 20, 30. Thus the voltage drop on capacitor 30 is VN1-VN5, and is the same as the voltage drop on variable resistor 54, VN2-VN3. VN1=VN2 and VN5=VN3, so the current flowing through resistor 54 will be sinking current into the output of op amp 50. Hence the voltage at node N2 near variable resistor 52 is negative and N1 is also negative.

The voltage being 90-degrees out-of-phase with the current on line 10 helps to compensate for the current changes in line 10, reducing EMI.

Figure 6:
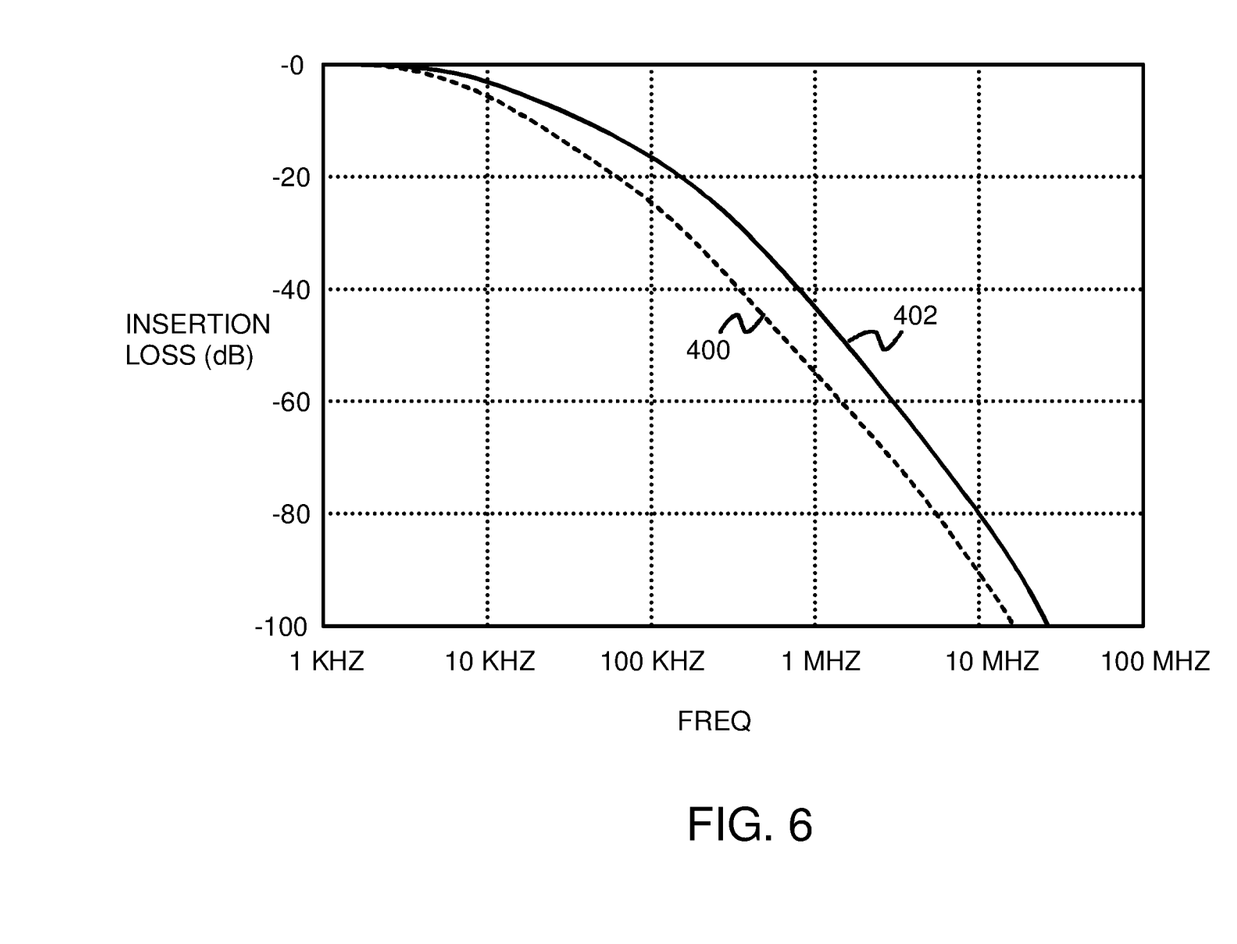
FIG. 6 is a graph showing a reduction in insertion loss using the active filter.

FIG. 6 is a graph showing a reduction in insertion loss using the active filter. Curve 402 shows the insertion loss for a passive LC filter where C has the same capacitance value as connection capacitor 20. Curve 400 shows the insertion loss for an active LC filter with the active filter such as shown in FIG. 4 and a theoretical series inductor L. The insertion loss is reduced by about 12 dB at 2 MHz using the active filter of FIG. 4 compared with a passive filter of the same capacitor size.

The active filter can also reduce EMI by as much as 75% at 2 MHz. A smaller capacitor in the active filter may be used to achieve the same EMI reduction as a passive filter. The size and bulk of the filter may be reduced.

Figure 7:
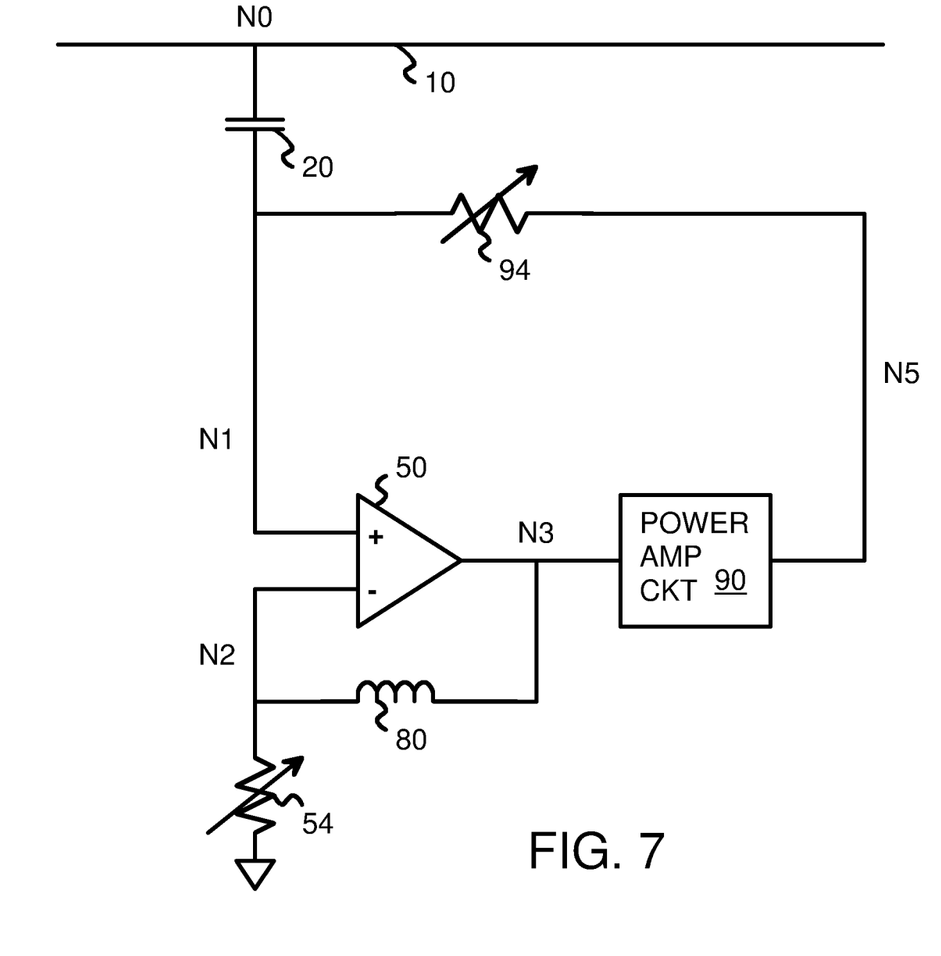
FIG. 7 is an alternative active filter with a variable resistor for feedback.

FIG. 7 is an alternative active filter with a variable resistor for feedback. Power amplifier circuit 90 can have transistors 22, 24 as shown in FIG. 4 driving node N5. However, transfer capacitor 30 is replaced by variable resistor 94 to convert the current from power amplifier circuit 90 to a voltage to couple to connection capacitor 20.

The output of op amp 50, node N3, is fed back through inductor 80 to the inverting input of op amp 50. Variable resistor 54 adjusts the overall gain. Inductor 80 is theoretical to account for parasitic inductances. For different frequency noise, the gain from op amp 50 is frequency dependent, making this alternative circuit more adaptive.

Figure 8:
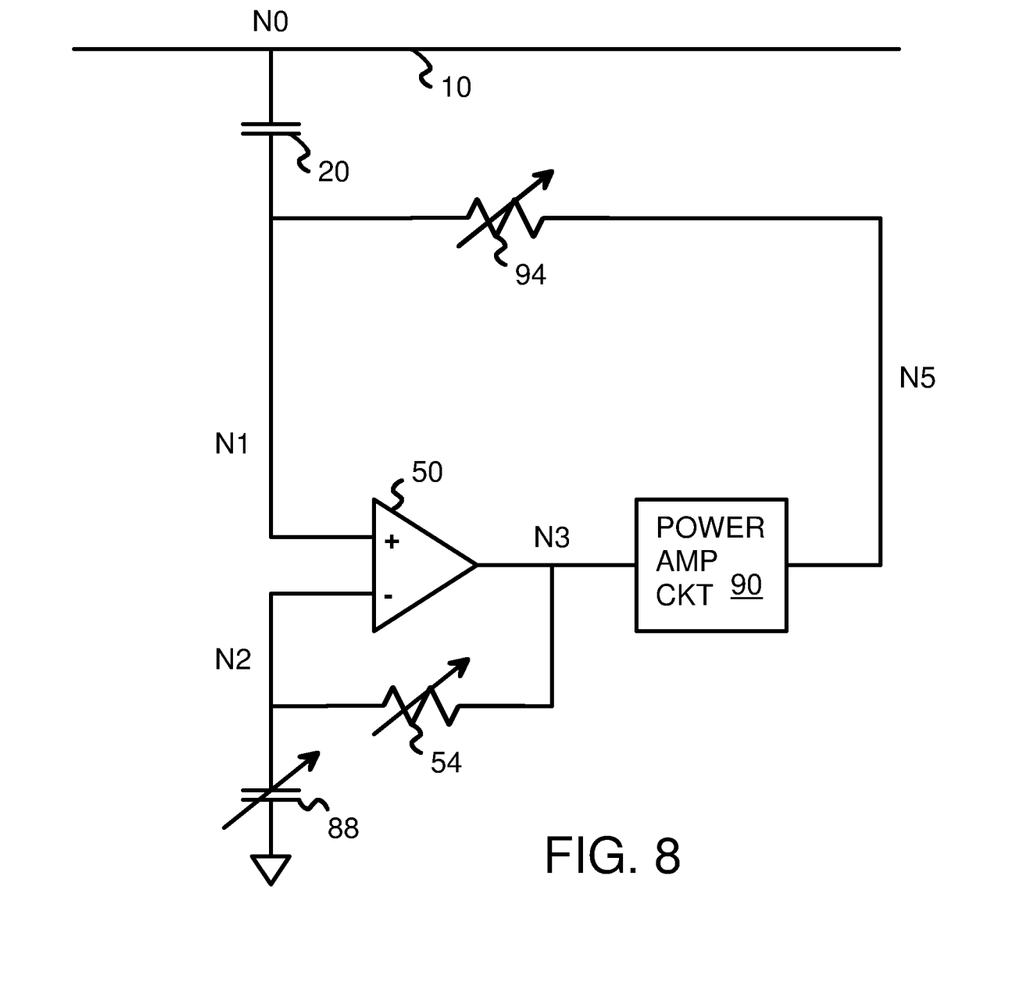
FIG. 8 is another alternative active filter with a variable resistor for feedback.

FIG. 8 is another alternative active filter with a variable resistor for feedback. Power amplifier circuit 90 can have transistors 22, 24 as shown in FIG. 4 driving node N5. Transfer capacitor 30 is replaced by variable resistor 94 to convert the current from power amplifier circuit 90 to a voltage to couple to connection capacitor 20.

The output of op amp 50, node N3, is fed back through variable resistor 54 to the inverting input of op amp 50, allowing variable resistor 54 to adjust the overall gain. Variable capacitor 88 connects the inverting input of op amp 50 to ground, so inductor 80 is avoided. For different frequency noise, the gain from op amp 50 is frequency dependent, making this alternative circuit more adaptive.

Figure 9:
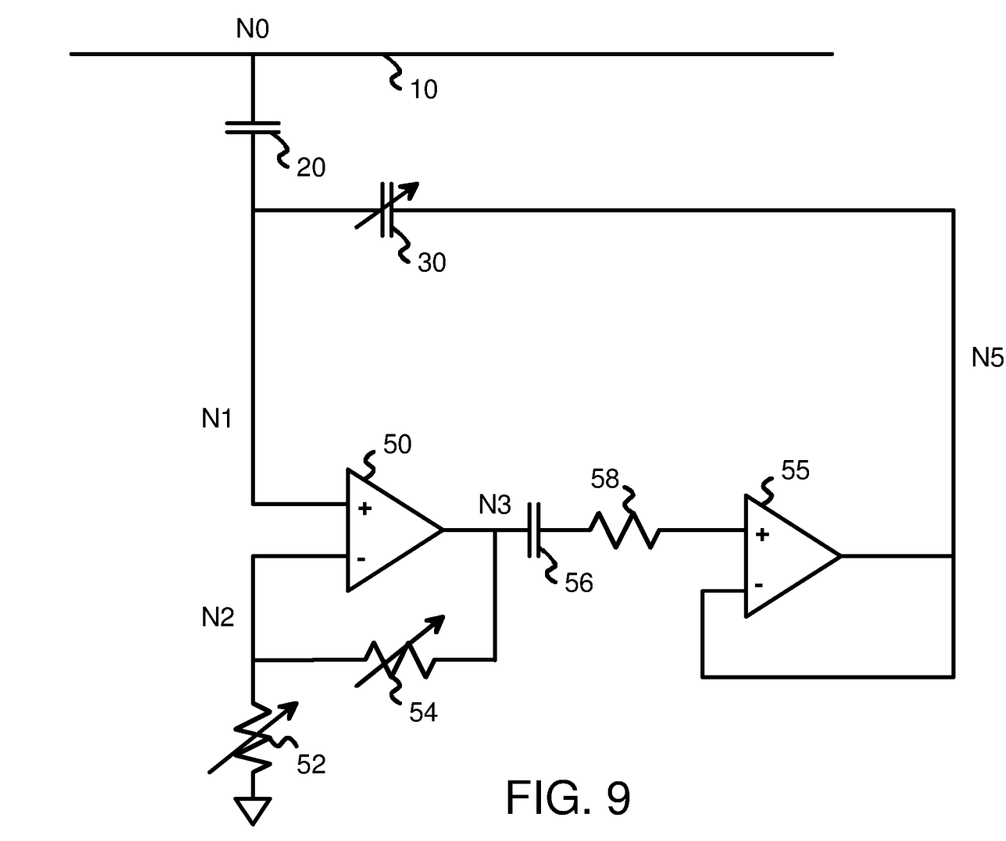
FIG. 9 is an alternative active filter with an op-amp second stage.

FIG. 9 is an alternative active filter with an op-amp second stage. Power amplifier circuit 90 is replaced by second op amp 55, which receives AC signals from the output of first op amp 50 that pass through filter capacitor 56 and resistor 58 to the non-inverting (+) input of second op amp 55. The inverting input of second op amp 55 is connected to its output, node N5, which drives transfer capacitor 30 as did the power amplifier described before.

Figure 10:
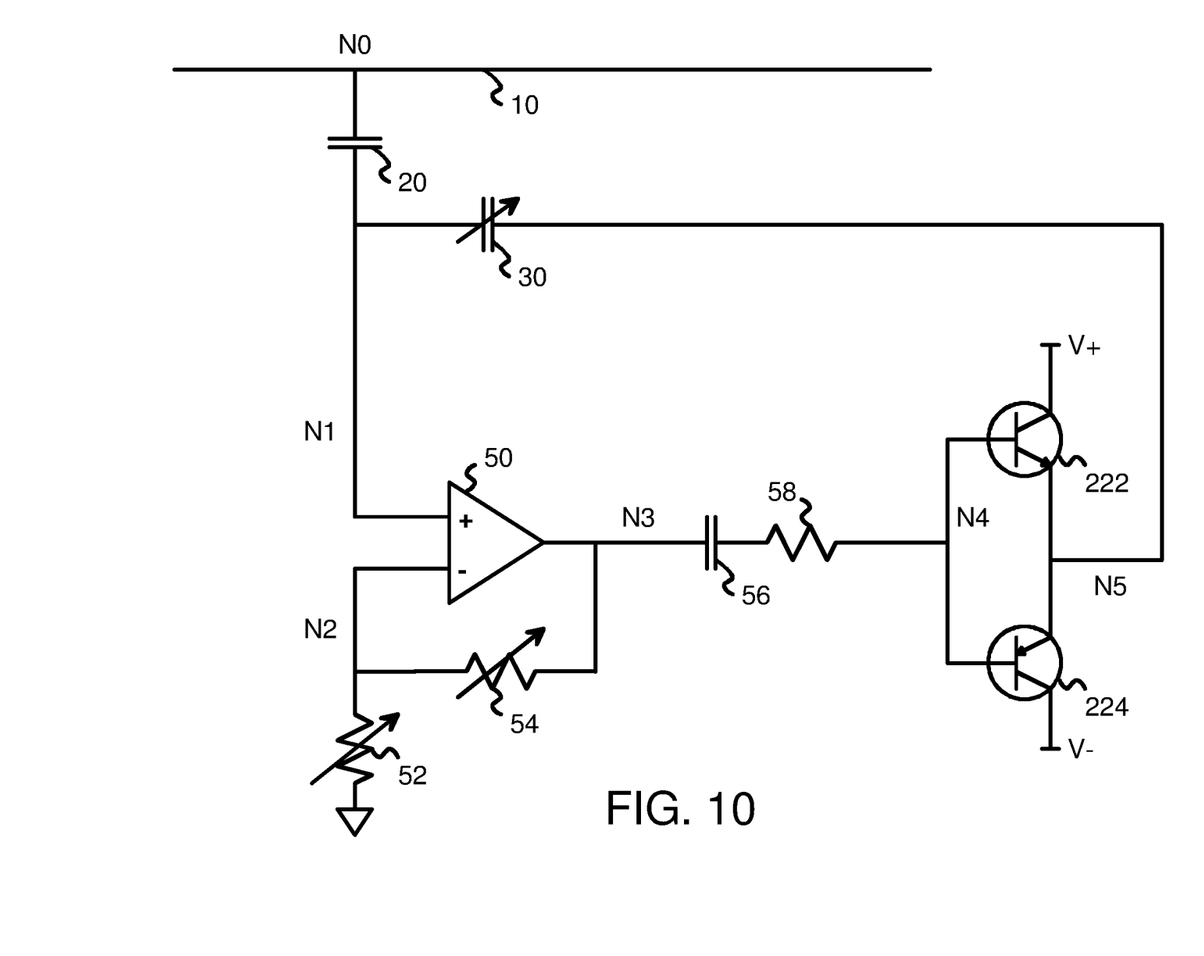
FIG. 10 is an active filter with a simplified power-amplifier second stage.

FIG. 10 is an active filter with a simplified power-amplifier second stage. The power amplifier has the bases of PNP transistor 222 and NPN transistor 224 driven directly by node N4 from filter capacitor 56 through resistor 58. This is a class B power amplifier circuit while FIG. 4 is a class AB amplifier.

Figure 11:
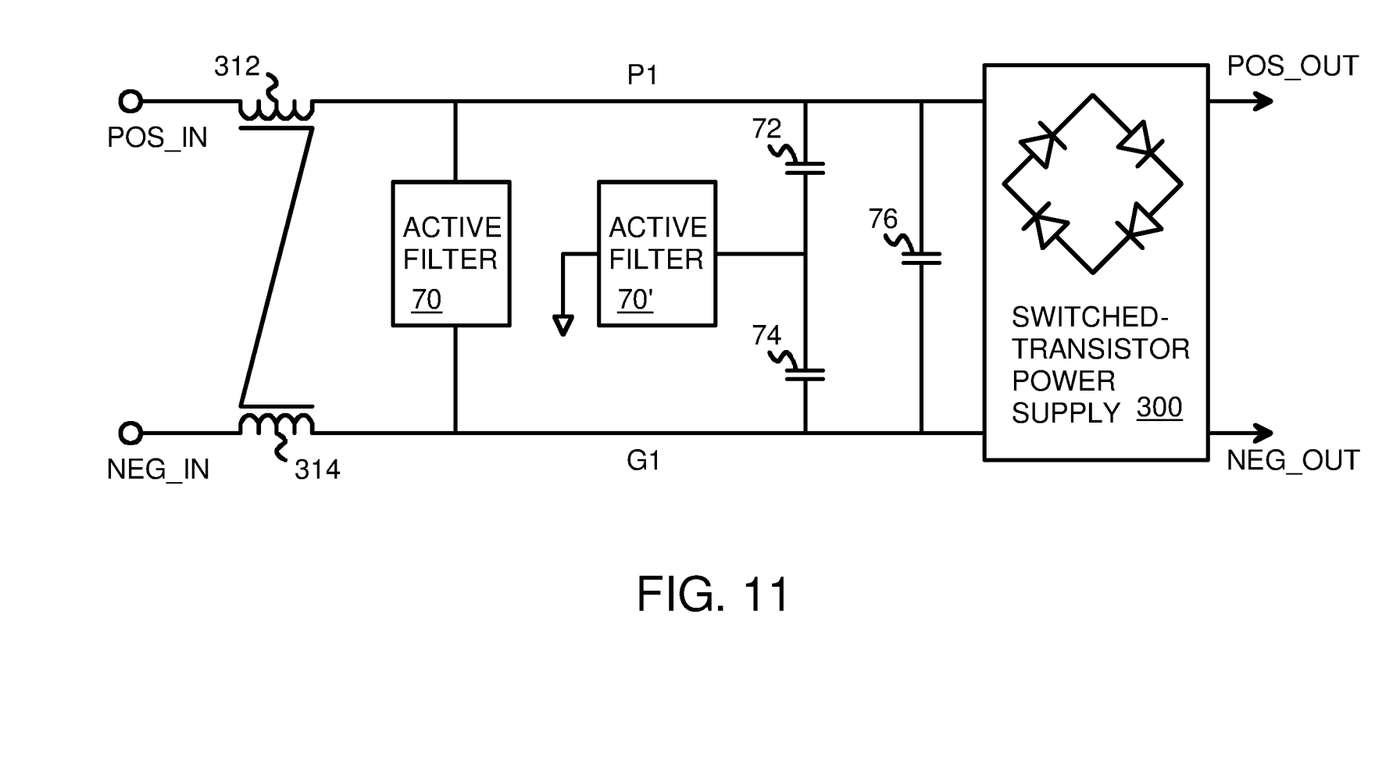
FIG. 11 shows active filters being used as differential and common-mode filters.

FIG. 11 shows active filters being used as differential and common-mode filters. Switched-Transistor Power Supply (STPS) 300 generates undesirable EMI. To reduce this EMI, active filter 70 is coupled between positive line P1 and negative line G1. Active filter 70 can be the active filter of FIG. 4 with line 10 being line P1 and ground being negative line G1.

Active filter 70' is connected to a common-mode node CM between capacitor 72 to P1, and capacitor 74 to G1. Active filter 70' can be the active filter of FIG. 4 with line 10 being the common mode node CM between capacitors 72, 74, and ground being negative line G1 or another ground node.

Inductor 312 filters POS_IN to generate node P1, while inductor 314 filters NEG_IN to generate G1. Capacitor 76 between P1 and G1 filters ripple in the power supply.

Figure 12:
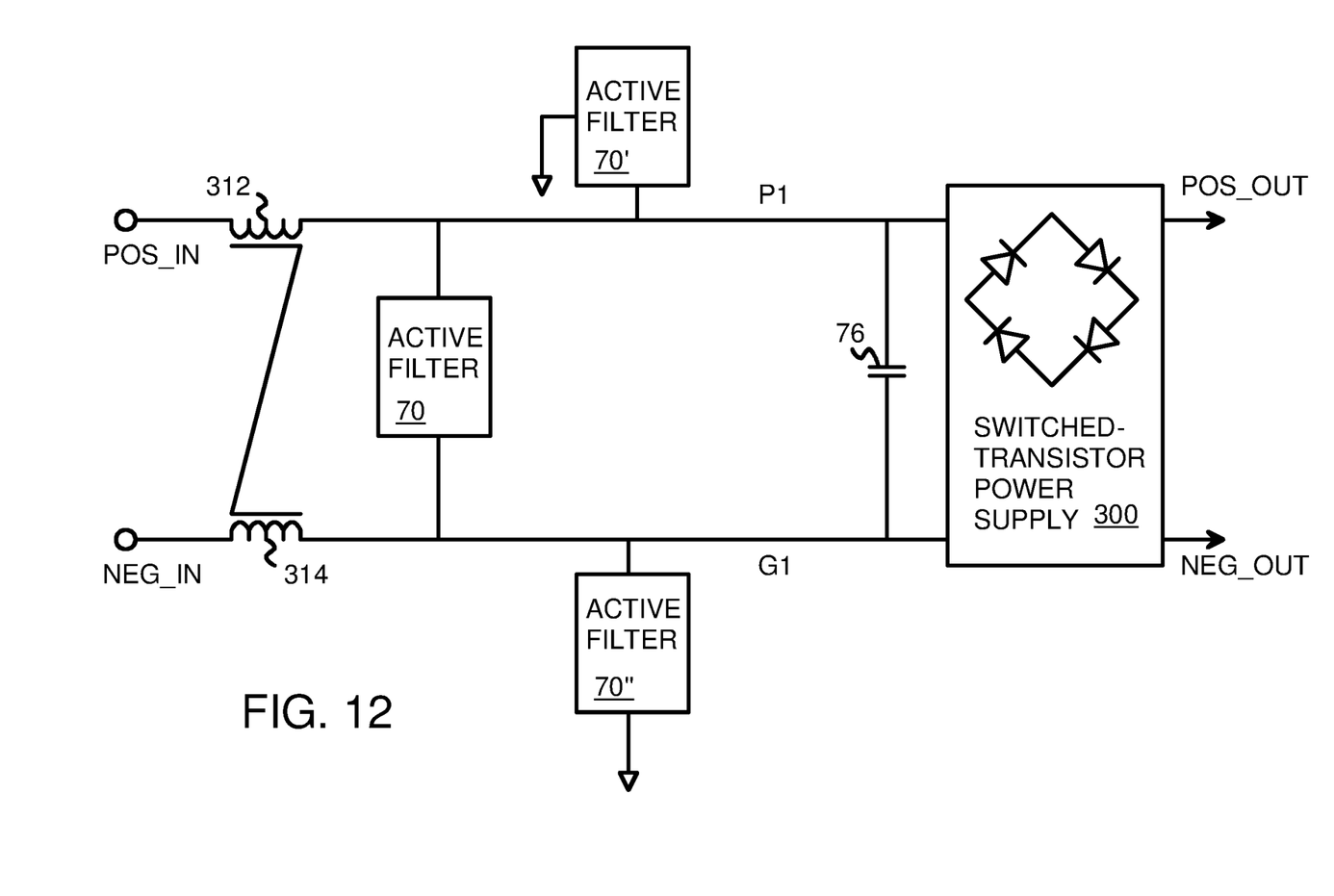
FIG. 12 shows active filters being used as differential and single-line filters.

FIG. 12 shows active filters being used as differential and single-line filters. Switched-Transistor Power Supply (STPS) 300 generates undesirable EMI. To reduce this EMI, active filter 70 is coupled between positive line P1 and negative line G1. Active filter 70 can be the active filter of FIG. 4 with line 10 being line P1 and ground being negative line G1.

Active filter 70' is connected to power line P1. Active filter 70' can be the active filter of FIG. 4 with line 10 being power line P1, and ground being an independent ground node such as earth in an AC system or COM in DC-DC systems.

Active filter 70" is connected to negative power line G1. Active filter 70" can be the active filter of FIG. 4 with line 10 being negative power line G1, and ground being an independent ground node.

ALTERNATE EMBODIMENTS

Several other embodiments are contemplated by the inventors. For example various op amp circuits and power amplifier circuits and configurations may be used. Feedback from the power amplifier may be modified. A single capacitor may be implemented as several parallel capacitors, and a variable capacitor may be implemented by a switched-capacitor array such as a binary-weighted capacitor array and a decoder. The op amp may be replaced with other active circuits that have an input impedance in the format of Z=-V/I, such as a power transistor circuit.

While reducing EMI on a power line has been described, EMI may also be reduced in downstream circuits that are powered by the power line. The active filter may be applied to a variety of applications for a variety of purposes other than EMI reduction. The active filter may be applied to internal nodes on an Integrated Circuit (IC) to reduce internal cross-talk interference. The active filter may be attached to an internal clock line to reduce EMI generated by that clock line. The active filter could be connected across differential data lines in a telecom system to filter noise on these lines. Application scenarios that need filters to reduce small signals can benefit from the invention.

A controller or initializer could be added to select the variable resistor and variable capacitor values. A temperature compensator could compensate the bandwidth of the gain-control unit using analog components such as a resistor and a Negative Temperature Coefficient (NTC) device such as a thermistor. The controller could be digital and receive a temperature measurement and look up values in a table to apply to the variable capacitor or variable resistors. The controller could likewise receive a mode bit that indicates a frequency of operation and adjust the variable capacitance or variable resistances according to settings from a look up table. Some of the variable components could be fixed while others are varied. For example, variable resistor 54 could be fixed and variable resistor 52 could be varied to select the gain over a range of gain values. For larger changes in gain values, variable resistor 54 could be adjusted as a coarse setting while variable resistor 52 is used as a fine setting, as one example.

Negative capacitance circuit 120 could be a negative impedance converter, a negative load, or another circuit that injects energy back into a system rather than stores energy from that system. While a phase shift of 90 degrees between the input sensed current and the output injected voltage has been shown in FIGS. 5A-5B, a different phase shift such as 180 degrees may be substituted, and the actual phase shift may depend on circuit delays.

Values could be scaled or otherwise operated upon. Parameters such as delays and targets could be adjusted or scaled based on conditions such as device temperature or length of time between detected faults, or statistics or properties of the particular load being driven. For example, large loads with large capacitances could have a longer setting for the TDIP delay and a larger value of the threshold TH than do loads with smaller capacitances or with less switching of load capacitances. When the load uses a higher-frequency clock, TDIP and TH could be increased to allow for more capacitor charging.

Currents may be positive currents or negative currents and may flow in either direction, depending on the carrier polarity. Various theories of operation have been presented to help understand the operation of the system as best understood, but these theories are only approximations of actual circuit behavior and may be incorrect.

Additional components may be added at various nodes, such as resistors, capacitors, inductors, transistors, buffers, dividers, etc., and parasitic components may also be present. Enabling and disabling the circuit could be accomplished with additional transistors or in other ways. Pass-gate transistors or transmission gates could be added for isolation. Inversions may be added, or extra buffering. Separate power supplies and grounds may be used for some components. Various filters could be added. Active low rather than active high signals may be substituted. Various reference voltages or virtual supplies may be used rather than a hard ground.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An active filter comprising:
    a connection capacitor connected between a current-carrying line and a first node;
    an op amp having a first input receiving the first node, the op amp having an op amp output;
    a power amplifier that generates an output current on a second node in response to the op amp output;
    a transfer capacitor connected between the first node and the second node;
    wherein changes in a line current on the current-carrying line induce a sense current through the connection capacitor that is converted to a transfer voyage by the transfer capacitor to inject an injected voltage back through the connection capacitor from the first node to the current-carrying line to compensate for changes in a line voltage on the current-carrying line;
    wherein the connection capacitor carries the sense current from the current-carrying line to the first node, and the connection capacitor also carries the injected voltage from the first node back to the current-carrying line,
    whereby the connection capacitor carries bi-directional signals to and from the current-carrying line.

2. The active filter of claim 1 wherein the active filter is connected to the current-carrying line only through the connection capacitor,
    wherein the current-carrying line is isolated from the active filter except for a single connection point through the connection capacitor.

3. The active filter of claim 2 further comprising:
    a second input of the op amp, the second input being an inverting input;
    a first gain-setting impedance coupled between the op amp output and the second input of the op amp;
    a second gain-setting impedance coupled between the second input of the op amp and a ground;
    wherein the first input of the op amp is a non-inverting input;
    wherein a gain of the op amp is set by impedance values of the first gain-setting impedance and the second gain-setting impedance.

4. The active filter of claim 3 wherein an impedance value of the first gain-setting impedance or of the second gain-setting impedance is compensated for temperature by a Negative-Temperature Coefficient (NTC) device in series with a resistor.

5. The active filter of claim 3 wherein the first gain-setting impedance and the second gain-setting impedance each comprise a variable resistor.

6. The active filter of claim 5 wherein the transfer capacitor further comprises a variable capacitor.

7. The active filter of claim 6 wherein the power amplifier further comprises:
a pull-up transistor that controls a pull-up current to the transfer capacitor in response to the op amp output;
a pull-down transistor that controls a pull-down current from the transfer capacitor in response to the op amp output.

8. The active filter of claim 7 wherein the pull-up transistor is a PNP transistor with a base controlled by the op amp output; and
wherein the pull-down transistor is a NPN transistor with a base controlled by the op amp output.

9. The active filter of claim 6 further comprising:
a filter capacitor connected between the op amp output and an input of the power amplifier.

10. The active filter of claim 6 further comprising:
a limiting resistor;
a filter capacitor;
wherein the limiting resistor and the filter capacitor are coupled together in series with each other and are coupled between the op amp output and an input of the power amplifier.

11. The active filter of claim 5 wherein the power amplifier further comprises:
a filter capacitor and a limiting resistor connected in series between op amp output and a second input node;
a second op amp having a non-inverting input receiving the second input node, and having an inverting input and a second op amp output connected together and to the transfer capacitor.

12. A single-connection-point active filter comprising:
a bi-directional connection point to a noisy line having a noisy current;
a connection capacitor connected from the bi-directional connection point to a first node;
a gain control circuit having the first node as an input, the gain control circuit having a second input connected to a second node, and an output connected to a third node;
a power amplifier circuit having the third node as an input, the power amplifier generating a sensing current on a fourth node in response to the third node;
a transfer impedance connected between the fourth node and the first node, the transfer impedance converting the sensing current to an output voltage;
wherein a voltage of the first node causes the transfer impedance to inject a compensation voltage back through the connection capacitor and into the noisy line at the bi-directional connection point;
wherein the compensation voltage compensates the noisy line for changes in the noisy current.

13. The single-connection-point active filter of claim 12 wherein the gain control circuit further comprises:
an op amp receiving the first node at a non-inverting input;
a first gain-setting variable impedance connected to an inverting input of the op amp that receives the second node; and
a second gain-setting impedance connected to the inverting input of the op amp that receives the second node.

14. The single-connection-point active filter of claim 13 wherein the transfer impedance comprises a variable capacitor;
wherein the first gain-setting variable impedance comprises a variable resistor connected between the third node and the second node;
wherein the second gain-setting impedance comprises a variable resistor connected between the second node and a ground.

15. The single-connection-point active filter of claim 13 wherein the transfer impedance comprises a variable resistor;
wherein the first gain-setting variable impedance comprises a variable resistor connected between the third node and the second node.

16. The single-connection-point active filter of claim 13 wherein the transfer impedance comprises a variable resistor;
wherein the first gain-setting variable impedance comprises a variable capacitor connected between the third node and the second node;
wherein the second gain-setting impedance comprises a variable resistor connected between the second node and a ground.

17. An active noise filter comprising:
a connection capacitor coupled between a connection point on a current-carrying line and a first node;
an op amp having the first node applied to a non-inverting input, the op amp generating an op amp output on a third node in response to the first node;
a first gain-setting impedance device connected to a second node applied to an inverting input of the op amp;
a second gain-setting impedance device connected between a ground and the second node;
a power amplifier generating an output current to a fourth node in response to the op amp output, wherein a peak value of the output current is greater than a peak value of a current generated by the op amp;
a transfer impedance connected between the fourth node and the first node, for converting the output current into a transfer voltage;
wherein the transfer voltage on the transfer impedance induces an injected voltage across the connection capacitor to compensate the current-carrying line,
whereby Electro-Magnetic Interference (EMI) generated by the current-carrying line is reduced by the active noise filter.

18. The active noise filter of claim 17 wherein the transfer impedance comprises a variable capacitor;
wherein the first gain-setting impedance device comprises a variable resistor connected between the third node and the second node;
wherein the second gain-setting impedance device comprises a variable resistor connected between the second node and the ground.

19. The active noise filter of claim 17 wherein the transfer impedance comprises a variable resistor;
wherein the first gain-setting impedance device comprises a variable capacitor connected between the third node and the second node;
wherein the second gain-setting impedance device comprises a variable resistor connected between the second node and the ground.

* * * * *